United States Patent
Cho et al.

(10) Patent No.: US 8,748,265 B2
(45) Date of Patent: Jun. 10, 2014

(54) SEMICONDUCTOR DEVICE WITH BURIED BIT LINE AND METHOD FOR FABRICATING THE SAME

(75) Inventors: Heung-Jae Cho, Gyeonggi-do (KR); Bong-Seok Jeon, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 13 days.

(21) Appl. No.: 13/463,108

(22) Filed: May 3, 2012

(65) Prior Publication Data

US 2013/0161832 A1 Jun. 27, 2013

(30) Foreign Application Priority Data

Dec. 26, 2011 (KR) .......................... 10-2011-0142200

(51) Int. Cl.
*H01L 21/336* (2006.01)

(52) U.S. Cl.
USPC ........................................ 438/268; 257/328

(58) Field of Classification Search
USPC ........... 438/268–270, 272; 257/302, 328–330
See application file for complete search history.

(56) References Cited

U.S. PATENT DOCUMENTS

| 7,518,182 | B2* | 4/2009 | Abbott et al. | 257/329 |
| 2006/0113587 | A1* | 6/2006 | Thies et al. | 257/328 |
| 2010/0197121 | A1* | 8/2010 | Kim et al. | 438/486 |
| 2011/0127605 | A1* | 6/2011 | Kim | 257/334 |
| 2011/0129975 | A1* | 6/2011 | Lee | 438/270 |
| 2011/0156134 | A1* | 6/2011 | Kim | 257/329 |

FOREIGN PATENT DOCUMENTS

| KR | 1020100078968 | 7/2010 |
| KR | 1020100113734 | 10/2010 |

OTHER PUBLICATIONS

Machine translation of KR 10-2010-0078968.*
Machine translation of KR 10-2010-0113734.*

* cited by examiner

*Primary Examiner* — Fernando L Toledo
*Assistant Examiner* — Bryan Junge
(74) *Attorney, Agent, or Firm* — IP & T Group LLP

(57) ABSTRACT

A semiconductor device includes: a punch stop region formed in a substrate; a plurality of buried bit lines formed over the substrate; a plurality of pillar structures formed over the buried bit lines; a plurality of word lines extending to intersect the buried bit lines and being in contact with the pillar structures; and an isolation layer isolating the word lines from the buried bit lines.

16 Claims, 15 Drawing Sheets

SEMICONDUCTOR DEVICE WITH BURIED BIT LINE AND METHOD FOR FABRICATING THE SAME

CROSS-REFERENCE TO RELATED APPLICATIONS

The present application claims priority of Korean Patent Application No. 10-2011-0142200, filed on Dec. 26, 2011, which is incorporated herein by reference in its entirety.

BACKGROUND

1. Field

Exemplary embodiments of the present invention relate to a technology of fabricating a semiconductor device, particularly, a semiconductor device with buried bit lines and a method of fabricating the semiconductor device.

2. Description of the Related Art

As the degree of integration of semiconductor memory devices increases, the cell structure has changed from $8F^2$ or $6F^2$ architecture to $4F^2$ architecture to reduce the area occupied by each unit cell in a plane, where F is a minimum feature size. As described above, various methods have been used to form components, such as a transistor, bit line, word lines, and capacitor, in response to the decrease in occupied area of the unit cell. In particular, a vertical channel semiconductor device that induces vertical channel by vertically arranging a source and a drain in order to implement a $4F^2$ cell structure has been developed.

In the vertical channel semiconductor device, the channel is formed perpendicular to the main surface of a substrate by forming a gate electrode around an active pillar extending perpendicular to the main surface of the substrate and forming source and drain regions above and under the active pillar around the gate electrode. Therefore, the channel length is not changed, even if the area of the semiconductor device decreases.

In more detail, a buried bit line (BBL) structure achieved by burying bit lines into a substrate under an active pillar has been developed to implement the vertical channel semiconductor device.

According to an example, buried bit lines are formed by forming a doped region by ion-implanting dopant into a substrate between active pillars and separating the doped region by etching the substrate between the active pillars. Here, resistance of the buried bit lines may be large due to physical limitation in having sufficient doping concentration.

A better method for reducing the resistance of the buried bit lines is to use metal having low resistance for the buried bit lines, but it is difficult to implement such a method. For example, a method of forming buried bit lines by forming a contact (so called, OSC (One Side Contact)) that exposes one side of an active pillar to use metal for the buried bit lines has been developed. However, the process of fabricating the buried bit lines formed in the OSC structure is complicated and the fabricating method is difficult.

SUMMARY

An embodiment of the present invention is directed to provide a semiconductor device equipped with low-resistant buried bit lines and a method of fabricating the semiconductor device.

In accordance with an embodiment of the present invention, a semiconductor device may include: a punch stop region formed in a substrate; a plurality of buried bit lines formed over the substrate; a plurality of pillar structures formed over the buried bit lines; a plurality of word lines extending to intersect the buried bit lines and being in contact with the pillar structures; and an isolation layer isolating the word lines from the buried bit lines.

In accordance with another embodiment of the present invention, a method of fabricating a semiconductor device includes: forming a punch stop region in a substrate; forming a plurality of pillar structures over the substrate, wherein each of the pillar structures has a stack layer of a sacrificial layer and an active layer; removing the sacrificial layer; forming a conductive layer between the pillar structures in the space where the sacrificial layer is removed; and forming a plurality of buried bit lines under the pillar structures by selectively etching the conductive layer.

DETAILED DESCRIPTION

Hereinafter, exemplary embodiments of the present invention will be described with reference to the accompanying drawings to enable a person with an ordinary skilled in the art to make and use the present invention.

Figure 1A:
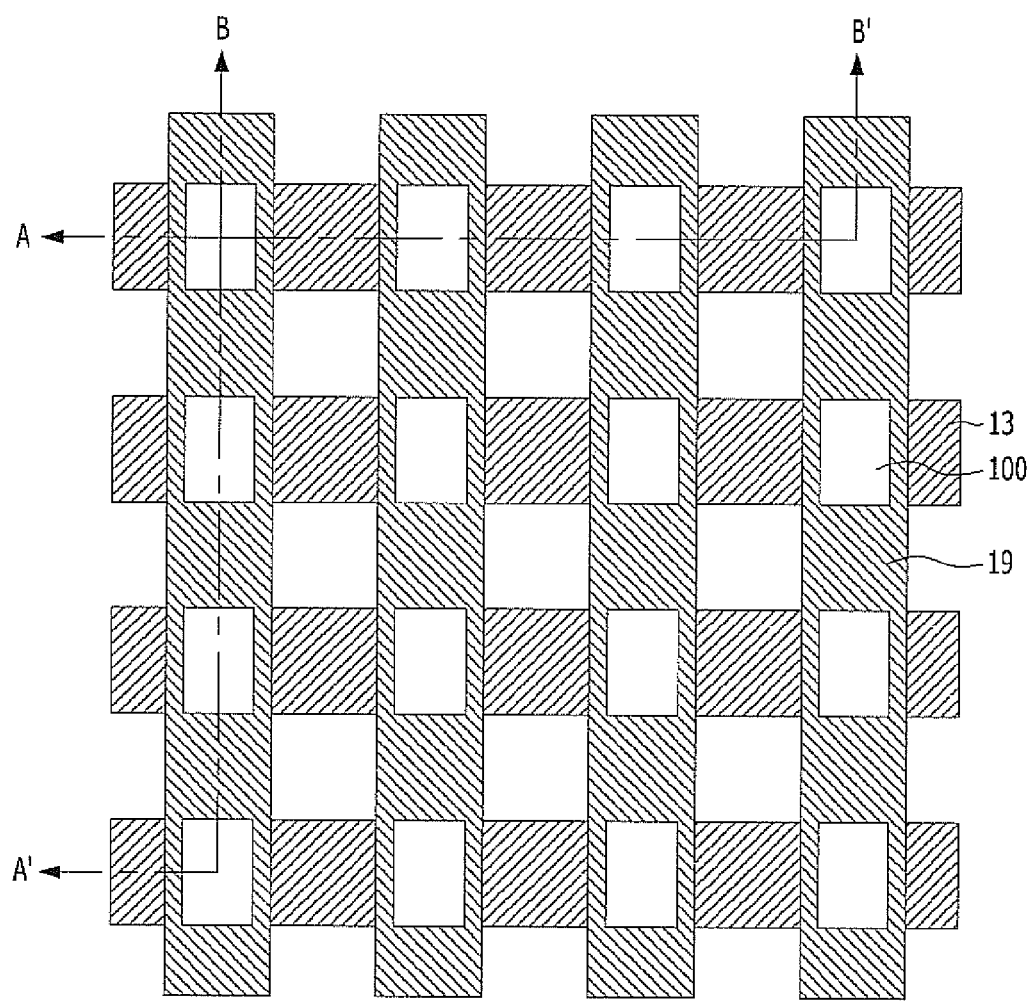
FIGS. 1A to 1C are diagrams illustrating a semiconductor device with buried bit lines in accordance with an embodiment of the present invention.
Figure 1B:
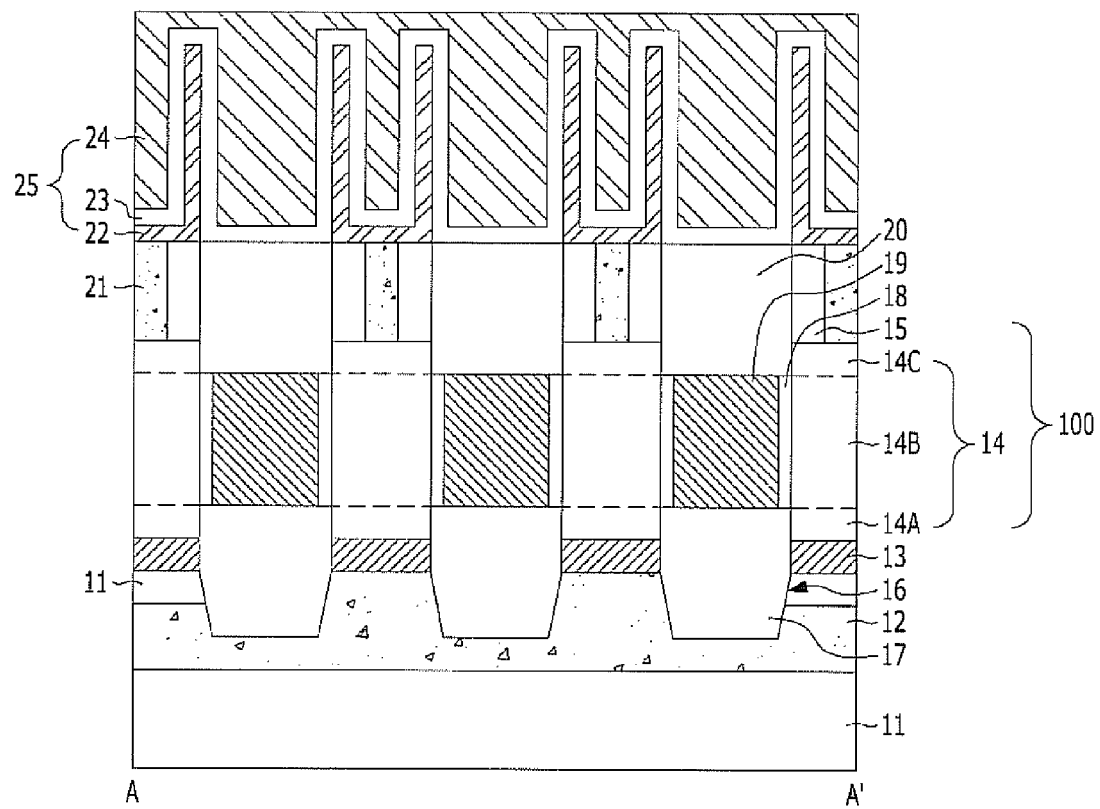
Figure 1C:
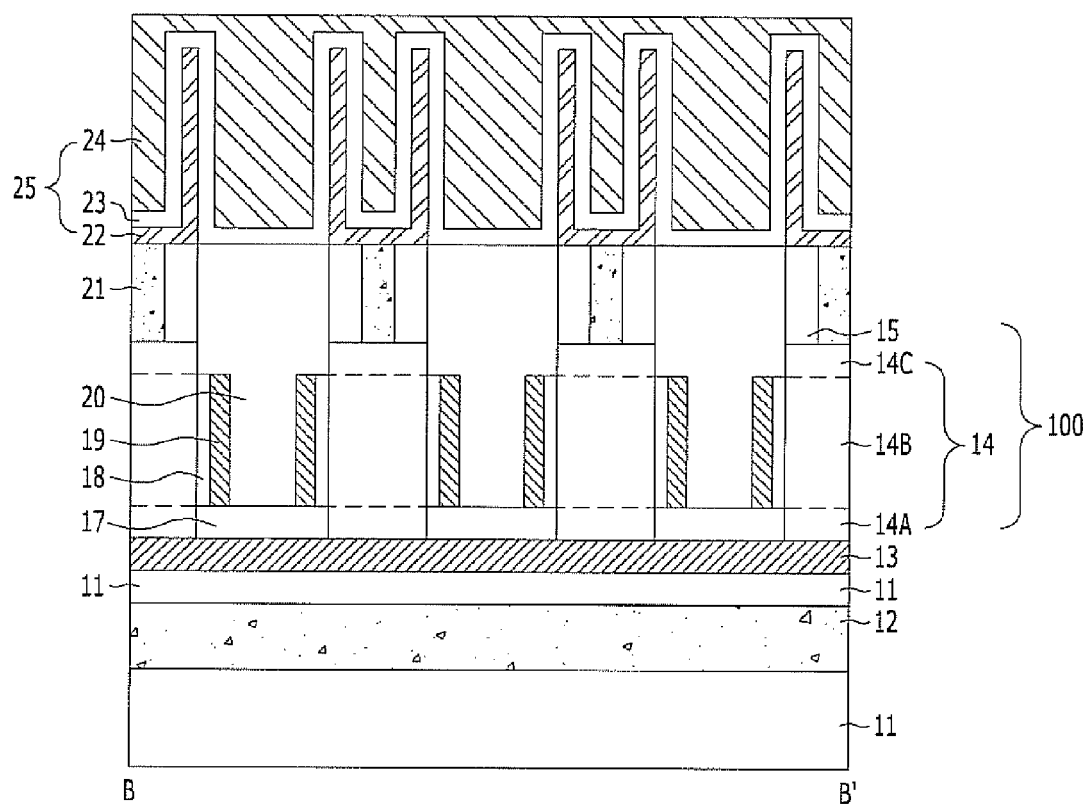

FIGS. 1A to 1c are diagrams illustrating a semiconductor device with buried bit lines in accordance with an embodiment of the present invention, in which FIG. 1A is a plan view, FIG. 1B is a cross-sectional view taken along the line A-A' of FIG. 1A, and FIG. 1C is a cross-sectional view taken along the line B-B' of FIG. 1A.

As illustrated in FIGS. 1A to 1C, a semiconductor device in accordance with an embodiment of the present invention includes a punch stop region 12 formed in a substrate 11, a plurality of pillar structures 100 formed on the substrate 11, a plurality of buried bit lines 13 inserted between the substrate 11 and the pillar structures 100 and extending in one direction, a plurality of word lines 19 extending to intersect the buried bit lines 13 in contact with the pillar structure 100, trenches 16 formed between the buried bit lines 13 in the substrate 11, and isolation layers 17 burying the gaps between the trenches 16 and the pillar structures 100, under the word lines 19.

The punch stop region 12 formed in the substrate 11 has a function of preventing punch between adjacent buried bit lines 13 and may be a doped region formed by ion-implanting dopant into the entire surface of the substrate 11. The dopant may be a p-type dopant, for example, boron (B). The punch stop region 12 may be disposed at a desired distance from the surface of the substrate 11 and positioned in the substrate 11. Such an arrangement increases a breakdown voltage for the buried bit lines 13 by disposing the substrate 11 between the buried bit lines 13 and the punch stop region 12.

The pillar structures 100 may have a pillar structure and may be arranged in a matrix type with desired distances in the front-rear direction and left-right direction. The pillar structure 100 may have a structure formed by stacking an active layer 14 and a hard mask pattern 15.

The active layer 14 of the pillar structure 100 may be an epitaxial layer because it functions as an actual active region or an active pillar. For example, the active layer 14 may be an epitaxial silicon layer, where a polycrystalline layer (for example, a polysilicon layer) may be used for the active layer 14. However, when the active layer 14 is formed by an epitaxial layer, a high-speed operation characteristic may be obtained because the carrier mobility is larger by about two-fold in the epitaxial layer than the polycrystalline layer.

The active layer 14 of the pillar structure 100 may have a structure formed by stacking a first junction region 14A, a channel region 14B, and a second junction region 14C. The first junction region 14A may be connected with the buried bit lines 13 and the second junction region 14C may be connected with a capacitor 25. The first and second junction regions 14A and 14C may have the same conductive type and the channel region 14B may have complementary conductive types with the first and second junction regions 14A and 14C. For example, the conductive type of the first and second junction regions 14A and 14B may be an N-type and the conductive type of the channel region 14B may be a P-type.

The buried bit lines 13 form a line pattern extending in one direction on the substrate 11 and the pillar structure 100 is formed on the buried bit lines 13. Therefore, the buried bit lines 13 connect the pillar structures 100 arranged in one direction. The buried bit lines 13 may include a metal layer to improve the performance of signal transmission. Further, although not illustrated, a metal barrier layer may be inserted between the active layer 14, the substrate 11, and the buried bit lines 13 to prevent diffusion of the buried bit lines 13 formed by metal layers. Further, an ohmic contact layer, for example, metal silicide may be inserted to decrease contact resistance between the active layer 14, the substrate 11, and the buried bit lines 13.

The word lines 19 are in contact with the plurality of pillar structures 100 arranged to intersect the extension direction of the buried bit lines 13. The word line 19 may be in contact with one side of the pillar structure 100 or may be composed of a first conductive line that is in contact with a side of the pillar structure and a second conductive line that is in contact with the other side of the pillar structure (that is, word line=first conductive line+second conductive line) or may surround the pillar structure 100, as illustrated in the figure. A gate insulation layer 18 is inserted between the word line 19 and the pillar structure 100. Therefore, the word line 19 also functions as a gate electrode and may be in contact with the channel region 14B of the active layer 14 of the pillar structure.

The trenches 16 formed between the buried bit lines 13 in the substrate 11 separate the buried bit lines 13 and may form a line pattern extending in the extension direction of the buried bit lines 13. The bottoms of the trenches 16 may be in contact with the punch stop region 12. In detail, the bottoms of the trenches 16 may be in contact with the punch stop region 12, the bottoms of the trenches 16 may be positioned inside the punch stop region 12, or the trenches 16 may pass through the punch stop region 12. According to an example, the bottoms of the trenches 16 are positioned inside the punch stop region 12 rather than the bottoms of the trenches 16 just touching the top surface of the punch stop region 12 without being located inside the punch stop region. According to another example, the trenches 16 pass through the punch stop region 12 rather than having the bottoms of the trenches 16 being positioned inside the punch stop region 12.

The isolation layer 17 isolates the adjacent buried bit lines 13, isolates the buried bit lines 13 from the word lines 19, forms buried portions of the trench 16 between the buried bit lines 13, forms buried portions of the trench 16 between the pillar structures 100, and insulates the buried bit lines 13 between the pillar structures 100 in the extension direction of the buried bit lines 13. Here, the portions of the trench between the pillar structures 100 refer to the portions formed between the first junction regions 14A of the active layer 14. According to an example, the isolation layer 17 may include an insulation layer.

Further, the semiconductor device in accordance with an embodiment of the present invention may further include a sealing layer 20 formed on the isolation layer 17 and the word lines 19 and bury the gap between the pillar structures 100, storage node contact plugs 21 connected to the second junction region 14C of the active layer 14 through the hard mask pattern 15, and a capacitor 25 connected to the storage node contact plugs 21.

The sealing layer 20 may include an insulating layer and the storage node contact plug 12 may include a silicon layer. The capacitor 25 may have a structure formed by stacking a storage node 22, a dielectric layer 23, and a plate electrode 24, where the storage node 22 may be shaped as a cylinder.

The semiconductor device in accordance with an embodiment of the present invention, which has the configuration described above, has the shape in which the pillar structures 100 are disposed on the buried bit lines 13, the structure is simple and capacitance between adjacent buried bit lines 13 can be reduced.

Further, the performance of signal transmission may be improved by reducing resistance of the buried bit lines 13, by forming the buried bit lines 13, using metal layers.

Further, adjacent buried bit lines 13 can be sufficiently separated by the punch stop region 12, the trenches 16, and the isolation layers 17, such that capacitance between adjacent buried bit lines 13 may be reduced.

FIGS. 2A to 2J are cross-sectional views illustrating the processes of a method of fabricating a semiconductor device with buried bit lines in accordance with a first embodiment of the present invention. FIGS. 2A to 2J are views taken along the line A-A' of FIG. 1A.

Figure 2A:
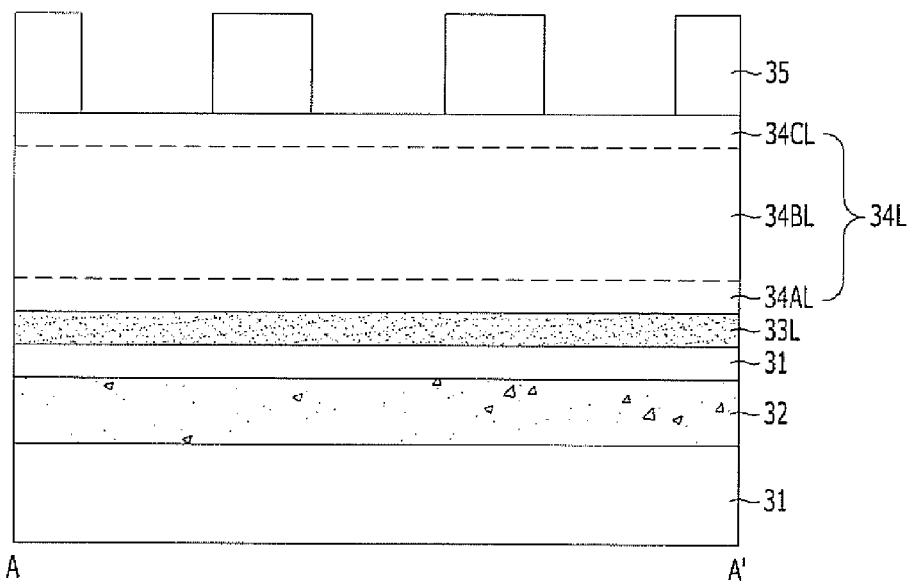
FIGS. 2A to 2J are cross-sectional views illustrating the processes of a method of fabricating a semiconductor device with buried bit lines in accordance with a first embodiment of the present invention.

As illustrated in FIG. 2A, a substrate 31 is implemented, for example, by forming a punch stop region 32 on a silicon substrate. The punch stop region 32 prevents punch phenomenon between subsequently formed buried bit lines. The punch stop region 32 may be disposed at a desired distance from the surface of the substrate 31 and positioned in the substrate 31. Such an arrangement improves a breakdown voltage for the buried bit lines by disposing the substrate 31 between the subsequently formed buried bit lines and the punch stop region 32. The punch stop region 32 may be formed by ion-implanting dopant into the substrate 31, in which the dopant may be a P-type dopant, for example, boron (B).

Next, a sacrificial layer 33L and an active layer 34L are sequentially formed on the substrate 31 having the punch stop region 32. The sacrificial layer 33L and the active layer 34L may form an epitaxial layer grown by using an epitaxial growth method, and the sacrificial layer 33L and the active layer 34L may be formed by in situ in the same chamber. Further, the sacrificial layer 33L may be made of a substance having an etching selection ratio for the active layer 34L and the substrate 31. For example, the sacrificial layer 33L may be formed by an epitaxial silicon germanium layer, and the active layer 34L may be formed by an epitaxial silicon layer.

The sacrificial layer 33L provides a space for forming subsequently formed buried bit lines. The reason that the sacrificial layer 33L is formed by an epitaxial layer is for forming the active layer 34L, which is formed on the sacrificial layer 33L, by an epitaxial layer. The first embodiment of the present invention exemplifies that the sacrificial layer 33L is formed by an epitaxial silicon germanium layer, but all of substances that can form the substrate 31, the active layer 34L, and the active layer 34L, which has an etching selection ratio and is formed at the upper portion, by an epitaxial layer can be applied to the sacrificial layer 33L.

The active layer 34L functions as an active region in a following process. The reason that the active layer 34L is formed by an epitaxial layer is because the carrier mobility is improved by about two orders and a high-speed operation characteristic can be implemented, when the active layer 34L is formed by an epitaxial layer, as compared with when it is formed by a polycrystalline layer (for example, polysilicon layer).

Further, since the active layer 34L functions as an active region, the first junction region 34AL, the channel region 34BL, and the second junction region 34CL can be sequentially stacked by implanting dopant in the process of forming the active layer 34L or ion-implanting dopant after the active layer 34L is formed. The first and second junction regions 34AL and 34CL may have the same conductive type and the channel region 34BL may have an opposite conductive type from the first and second junction regions 34AL and 34CL. For example, the conductive type of the first and second junction regions 34AL and 34CL may be an N-type and the conductive type of the channel region 34BL may be a P-type. The reason of forming the channel region 34BL and the first and second junction regions 34AL and 34CL in the process of forming the active layer 34L is because the degree of difficulty of the process is low and it is possible to easily control doping (or implanting) of dopant and diffusion, as compared with when they are formed after pillar structures that are formed by a following process.

Next, hard mask patterns 35 are formed on the active layer 34L. The hard mask patterns 35 may be formed as a line type extending in the extension direction of the buried bit lines. Therefore, the hard mask patterns 35 may be formed by a buried bit line mask.

Figure 2B:
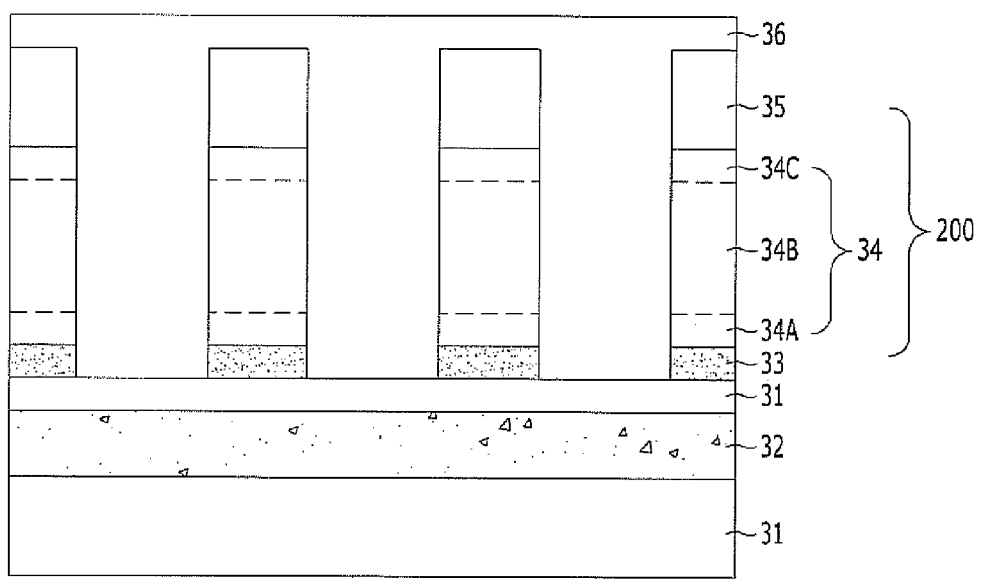

As illustrated in FIG. 2B, a plurality of pillar structures 200 are formed by etching the active layer 34L and the sacrificial layer 33L by using the hard mask patterns 35 as an etch barrier until the substrate 32 is exposed. The pillar structures 200 have a structure formed by stacking sacrificial layer patterns 33, active layer patterns 34, and the hard mask patterns 35 and have a line type structure extending in the extension direction of the buried bit lines.

Next, an insulation layer 36 is formed on the entire surface of the substrate 31 to cover the pillar structures 200. The insulation layer 36 may be formed by any one selected from a group of an oxide layer, a nitride layer, and an oxide nitride layer. For example, the insulation layer 36 may be formed by an oxide layer.

Next, a planarization process is performed on the surface of the insulation layer 36. This is for removing any steps generated on the surface from the process of forming the insulation layer 36 to cover the pillar structures 200 and may be performed by chemical-mechanical polishing (CMP).

Figure 2C:
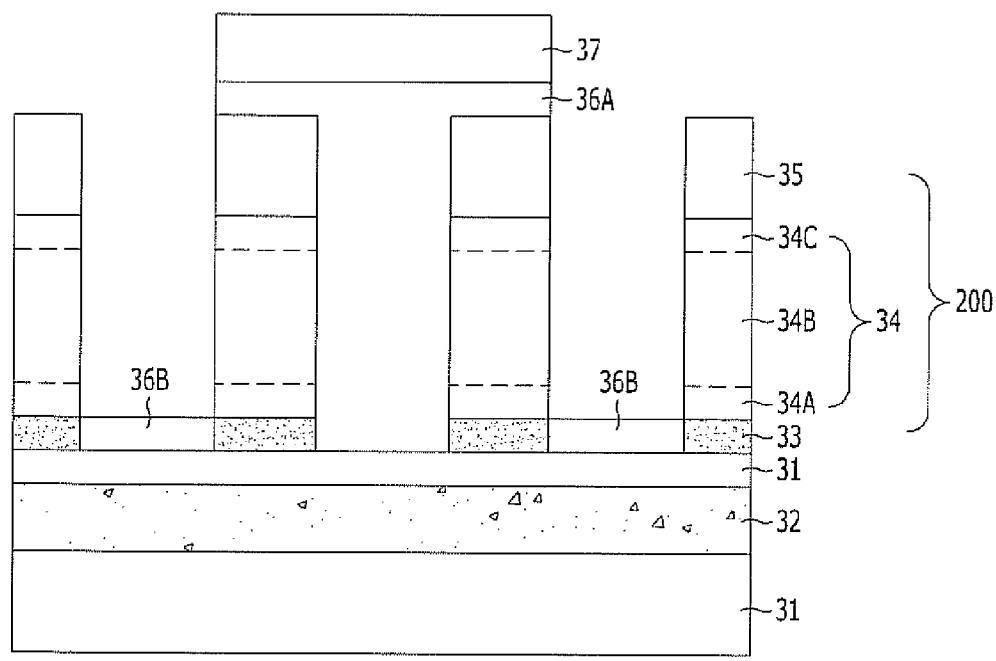

As illustrated in FIG. 2C, a photoresist pattern 37 is formed on the insulation layer 36. The photoresist pattern 37 may be formed as a line type extending in the extension direction of the buried bit lines and may be formed to cover a pair of pillar structures 200 based on any one of the pillar structures 200.

Next, an etching process is performed on the insulation layer 36 by using the photoresist pattern 37 as an etch barrier until the sides of the active layer patterns 34 of the pillar structures 200 are exposed. As a result, first and second insulation patterns 36A and 36B are formed. At this time, the etching process is performed such that the second insulation patterns 36B remains between the sacrificial layer patterns 33. The insulation layer 36 may be etched by using any one of dry etching and a wet etching, or combination of dry etching and wet etching.

Figure 2D:
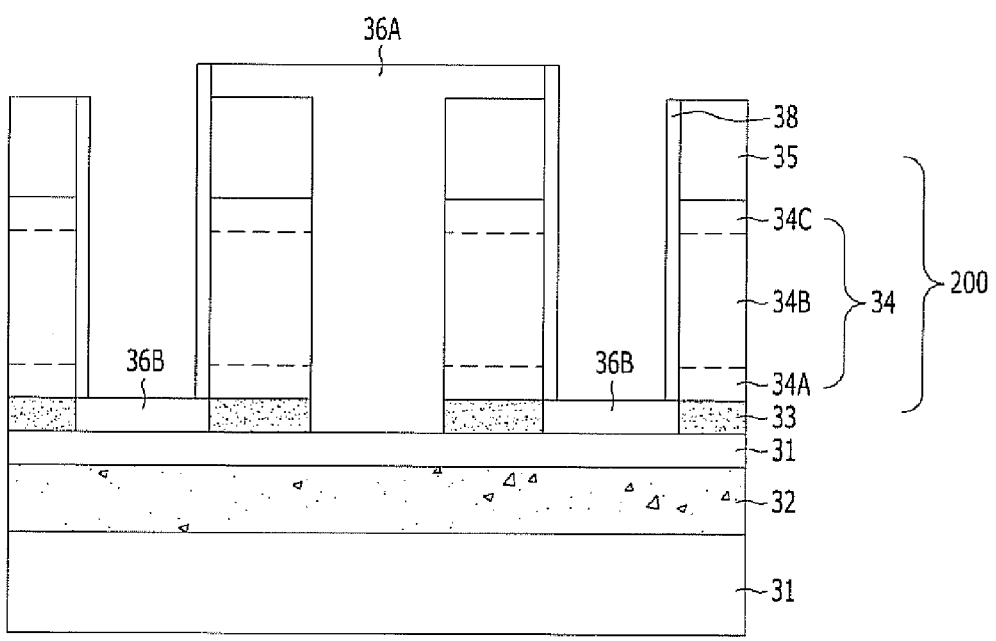

As illustrated in FIG. 2D, spacers 38 are formed on the sides of the pillar structures 200 after the photoresist pattern 37 is removed. The spacers 38 have a function of protecting the sides of the pillar structures 200 in a following process. The spacers 38 may be formed by any one selected from a group of an oxide layer, a nitride layer, and an oxide nitride layer and may be made of a substance having an etching selectivity with the insulation layer 36. For example, the spacers 38 may be formed by a nitride layer.

Figure 2E:
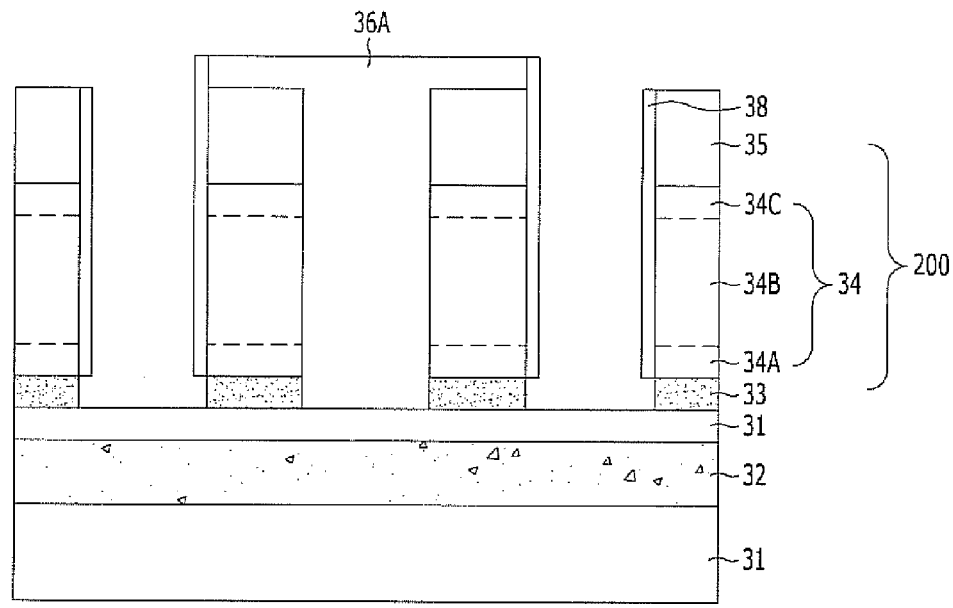

As illustrated in FIG. 2E, the second insulating patterns 36B remaining between the pillar structures 200 are removed. That is, the sides of the sacrificial layer patterns 33 are exposed by removing the second insulating patterns 36B remaining between the sacrificial layer patterns 33. In this process, some parts of the first insulating pattern 36A buried between the pillar structures 200 are removed while the remainder is buried between the pillar structures 200. The second insulating patterns 36B may be etched by using any one of dry etching and a wet etching, or combination of dry etching and wet etching.

Figure 2F:
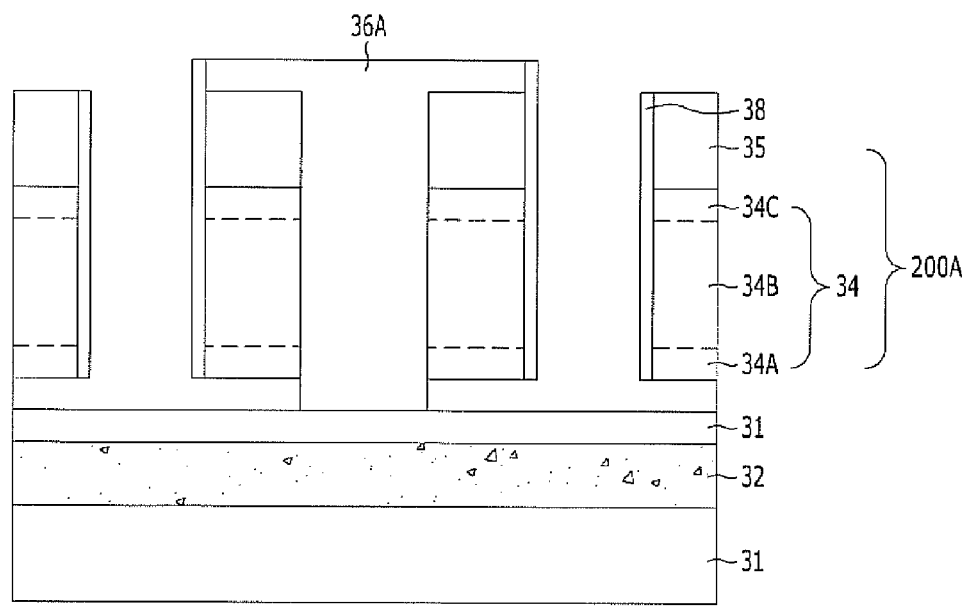

As illustrated in FIG. 2F, a space for forming buried bit lines under the active layer patterns 34 is provided by removing the sacrificial layer patterns 33 pass through the sides of the sacrificial layer patterns 33 exposed by removing the second insulating patterns 36B. The sacrificial layer patterns 33 may be etched by any one of dry etching and a wet etching, or combination of dry etching and wet etching. Hereafter, the pillar structures 200 with the sacrificial layer patterns 33 removed are designated by a reference numeral '200A'. The pillar structures 200A with the sacrificial layer patterns 33 removed have a structure in which the active layer patterns 34 and the hard mask patterns 35 are stacked and have a line type of structures extending in the extension direction of the buried bit lines.

Meanwhile, although not illustrated in the figures, both ends of the pillar structures 200A are fixed and there are regions with the sacrificial layer patterns 33 not removed and partially remaining by difference in gaps (or line width) between the pillar structures 200A, such that the pillar structures 200A may be prevented from falling down or deforming, even if the sacrificial layer patterns 33 are removed in order to provide a space for forming the buried bit lines.

Further, the pillar structures 200A can be more effectively prevented from falling down or deforming by the remaining first insulation pattern 36A, when the sacrificial layer patterns 33 are removed to provide a space for forming the buried bit lines.

Figure 2G:
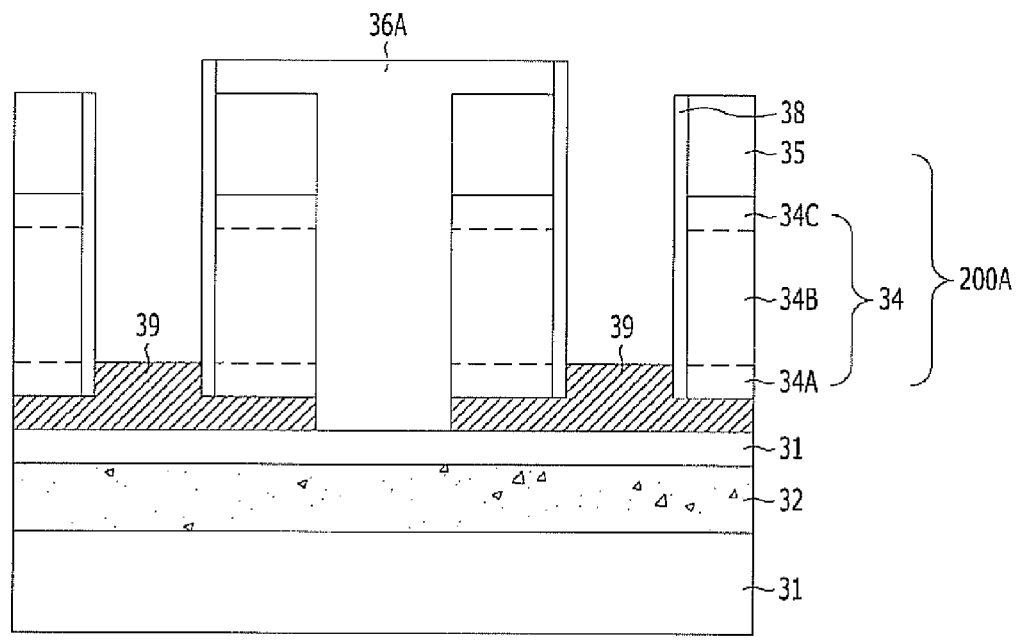

As illustrated in FIG. 2G, a conductive layer 39 that partially buries the portions between the pillar structures 200A while burying the space with the sacrificial layer patterns 33 removed is formed after a metal barrier layer (not illustrated) is formed along the structure surface including the pillar structures 200A. The conductive layer 39 operates the buried bit lines in a following process. Therefore, the conductive layer 39 may be formed by metal layers to form low-resistant buried bit lines. Further, the metal barrier layer has a function of preventing diffusion of the conductive layer 39 formed by metal layers.

Meanwhile, a process of forming silicide may be performed to reduce contact resistance in the regions where the active layer patterns 34, the substrate 31, and the conductive layer 39 are in contact, before forming the conductive layer 39. The process of forming silicide may be performed by sequentially forming silicide on the surface of the active layer patterns 34 and the substrate 31 exposed by heat treatment after the metal layers are formed along the structure surface including the pillar structures 200A and removing non-reacted metal layers.

Figure 2H:
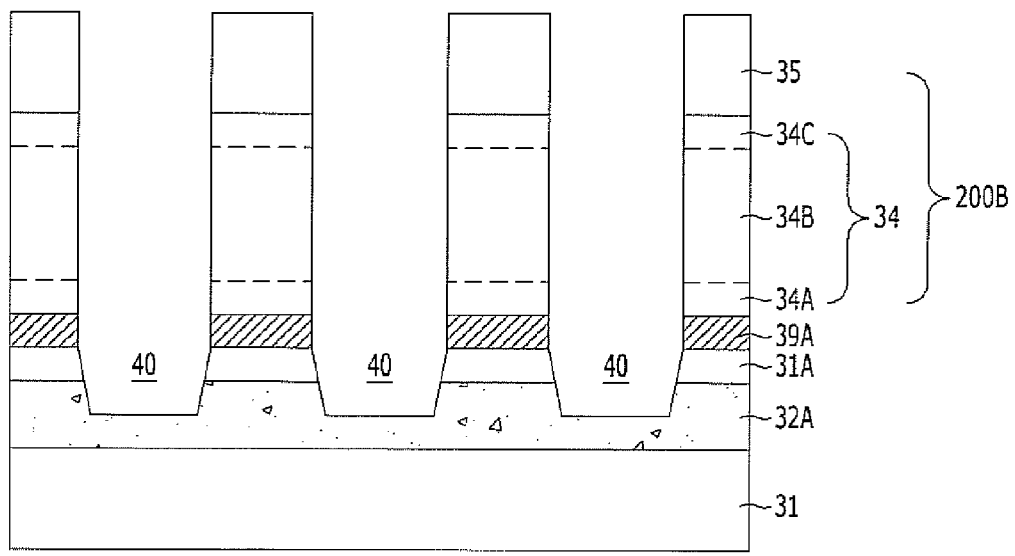

As illustrated in FIG. 2H, a plurality of buried bit lines 39A are formed by etching the conductive layer 39 and the substrate 31 with the hard mask patterns 35 as an etch barrier after the first insulating pattern 36A and the spacers 38 are removed. A trench 40 formed on the substrate 31 in the process of forming the buried bit lines 39A has a function of separating adjacent buried bit lines 39A and may form a line pattern extending in the extension direction of the buried bit lines 39A. The bottoms of the trench 40 have the depth to at least contact a punch stop region 32A through a substrate 31A to sufficiently separate adjacent buried bit lines. For example, the bottoms of the trench 40 may be in contact with the punch stop region 32A, the bottoms of the trench 40 may be positioned inside the punch stop region 32A, or the trench 40 may pass through the punch stop region 32A.

Next, although not illustrated, the pillar structures 200A are etched to intersect the buried bit lines 39A until the buried bit lines 39A are exposed. As a result, the pillar structures 200A have a pillar shape and are arranged in a matrix shape at desired distances from adjacent pillar structures 200A from the front to the rear and from the right to the left. Hereafter, the pillar structures 200A having pillar shapes are designated by a reference numeral '200B'.

Figure 2I:
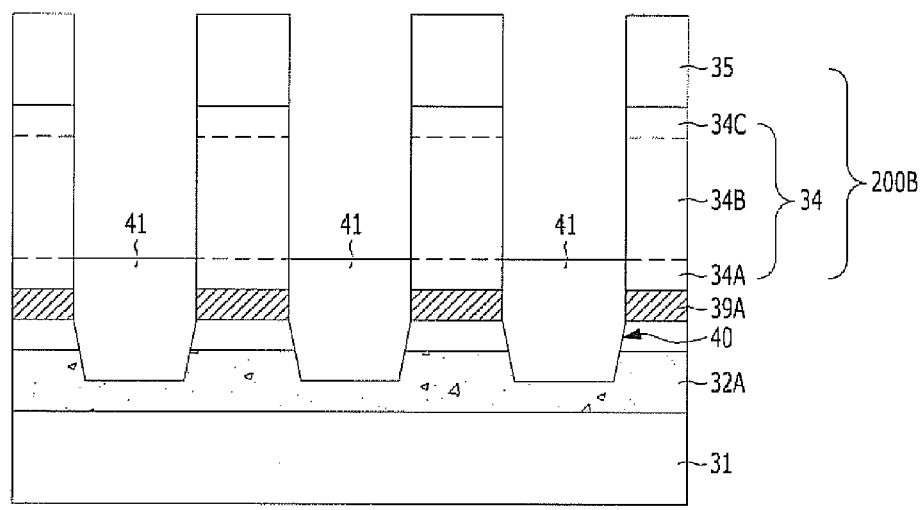

As illustrated in FIG. 2I, an isolation layer 41 that partially buries the portions between the pillar structures 200B while burying the trench 40 is formed. The isolation layer 41 may be formed to bury the portions between the first junction region 34A of the pillar structures 200B. Here, the upper surface of the isolation layer 41 may be positioned on the same plane as the interface between the first junction region 34A and the channel region 34B or positioned between the interface of the first junction region 34A and the channel region 34B and the interface of the first junction region 34A and the buried bit lines 39A.

The isolation layer 41 has a function of isolating adjacent buried bit lines 39A and isolating the buried bit lines 39A from subsequently formed word lines. Therefore, the isolation layer 41 may be formed by an insulation layer and the insulation layer may be any one selected from a group of an oxide layer, a nitride layer, and an oxide nitride layer. For example, the isolation layer 41 may be formed by an oxide layer.

Figure 2J:
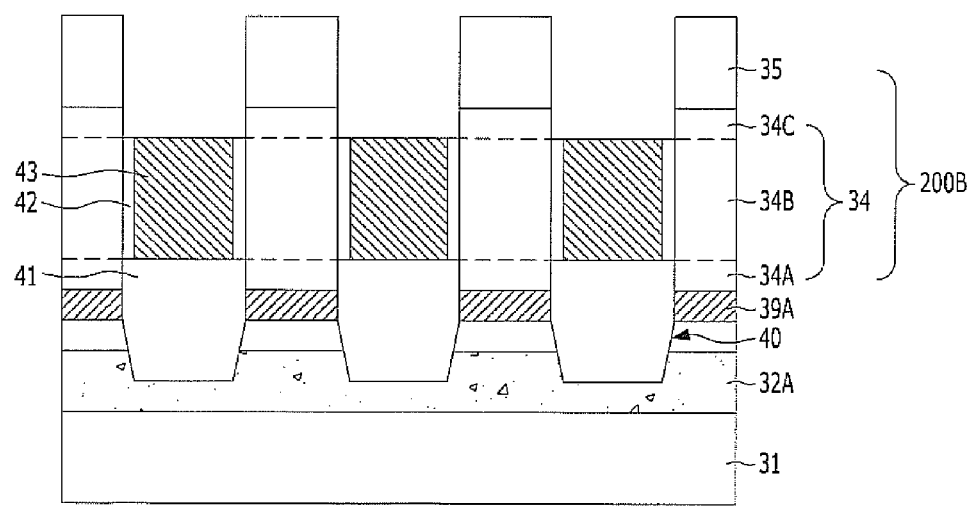

As illustrated in FIG. 2J, a gate insulation layer 42 is formed on the surfaces of the pillar structures 200B, in detail, on the surfaces of the channel region 34B of the active layer patterns 34. The gate insulating layer 42 may be formed by oxidation (for example, thermal oxidation) or deposition.

Next, a plurality of word lines 43 extending to intersect the buried bit lines 39A in contact with the pillar structures 200B are formed on the isolation layer 41. The word lines 43 may be formed by metal layers and may be in contact with selected sides of the pillar structures 2008 or surround the pillar structures 200B. Since the gate insulation layer 42 is inserted between the word lines 43 and the pillar structures 200B, the word lines 43 also function as gate electrodes.

The word lines 43 may be formed by sequential processes of adjusting the height of a conductive layer by performing a recess process after depositing the conductive layer on the entire surface of the substrate 31 and then patterning the conductive layer in a line type of pattern extending to intersect the buried bit lines 39A.

Thereafter, although not illustrated in the figures, a semiconductor device with buried bit lines is completed by sequentially performing a process of forming a sealing layer that buries the portions between the pillar structures, a process of forming a storage node contact plug, and a process of forming capacitors.

Since the semiconductor device formed in accordance with the first embodiment of the present invention makes it easy to form the buried bit lines 39A by metal layers, low-resistant buried bit lines 39A may be easily implemented.

Further, since the structure of the semiconductor device is simple, the processes can be simplified even if the buried bit lines 39A are formed by metal layers. Thus, manufacturing productivity can be increased.

FIGS. 3A to 3I are cross-sectional views illustrating the processes of a method of fabricating a semiconductor device with buried bit lines in accordance with a second embodiment of the present invention. FIGS. 3A to 3I are views taken along the line A-A' illustrated in FIG. 1.

Figure 3A:
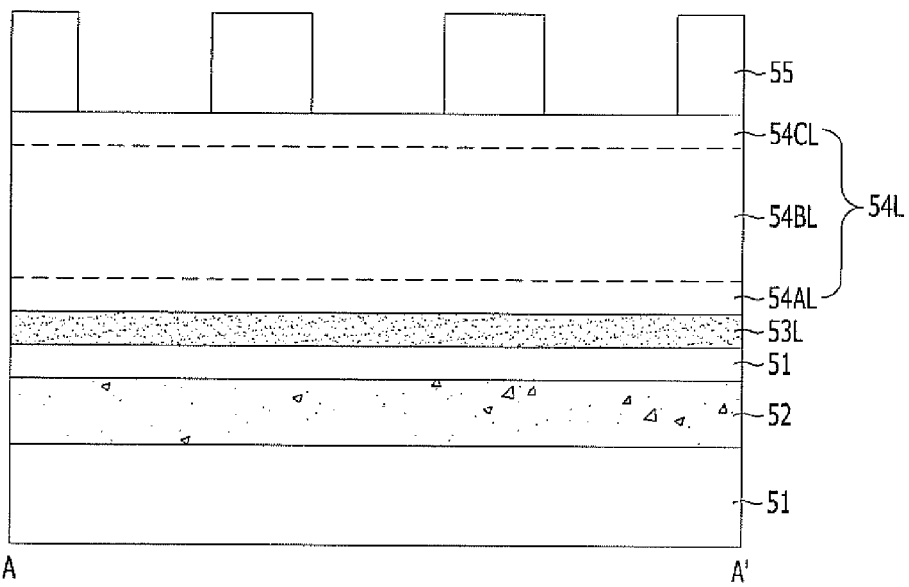
FIGS. 3A to 3I are cross-sectional views illustrating the processes of a method of fabricating a semiconductor device with buried bit lines in accordance with a second embodiment of the present invention.

As illustrated in FIG. 3A, a punch stop region 52 is formed in a substrate 51, for example, a silicon substrate. The punch stop region 52 has a function of preventing punch between buried bit lines that are formed by following processes. The punch stop region 52 may be formed by ion-implanting dopant into the substrate 51, where the dopant may be a P-type dopant, for example, boron (B).

Next, sacrificial layer patterns 53L and active layer patterns 54L are sequentially formed on the substrate 51 having the punch stop region 52. The sacrificial layer patterns 53L and the active layer patterns 54L may form an epitaxial layer formed by using an epitaxial growth method, and the sacrificial layer patterns 53L and the active layer patterns 54L may be formed by in situ method in the same chamber. Further, the sacrificial layer patterns 53L may be formed of a substance having an etching selectivity with respect to the active layer patterns 54L and the substrate 51. For example, the sacrificial layer patterns 53L may be formed by an epitaxial silicon germanium layer and the active layer patterns 54L may be formed by an epitaxial silicon layer.

Since the active layer patterns 54L functions as an active region, it may be formed by sequentially stacking a first junction region 54AL, a channel region 54BL, and a second junction region 54CL, by implanting dopant in the process of forming the active layer patterns 54L or ion-implanting dopant after forming the active layer patterns 54L. The first and second junction regions 54AL and 54CL may have the same conductive type and the channel region 54BL may have complementary conductive types with the first and second junction regions 54AL and 54CL. For example, the conductive type of the first and second junction regions 54AL and 54CL may be an N-type and the conductive type of the channel region 54BL may be a P-type.

Next, a plurality of hard mask patterns 55 are formed on the active layer patterns 54L. The hard mask patterns 55 may be formed as a line type extending in the extension direction of the buried bit lines. Therefore, the hard mask patterns 55 may be formed by a buried bit line mask.

Figure 3B:
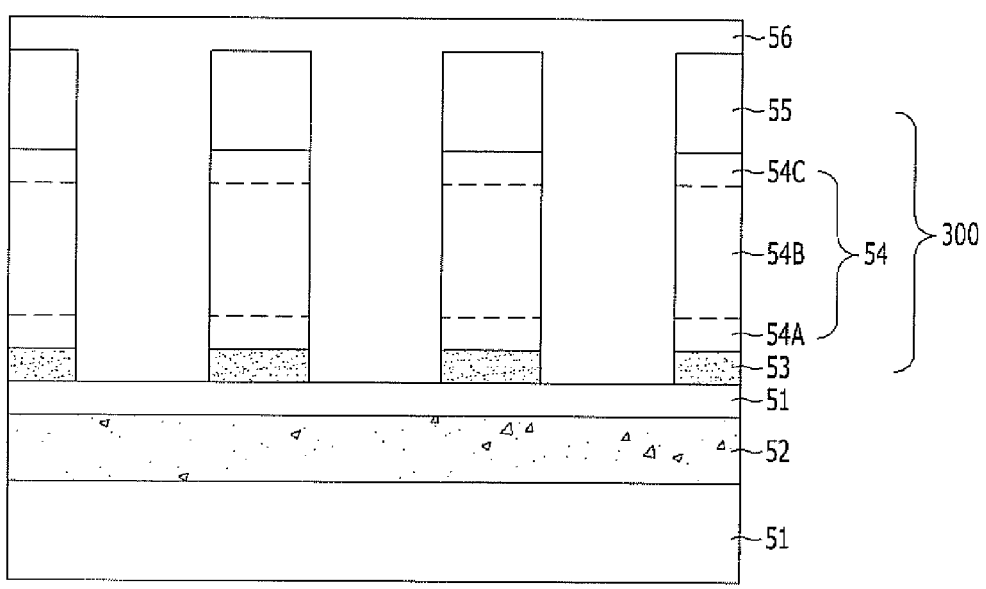

As illustrated in FIG. 3B, a plurality of pillar structures 300 are formed by etching the active layer patterns 54L and the sacrificial layer patterns 53L by using the hard mask patterns 55 as an etch barrier until the substrate 51 is exposed. As a result, a plurality of active layer patterns 54 and sacrificial layer patterns 53 are formed. The pillar structures 300 have a structure formed by stacking the sacrificial layer patterns 53, the active layer patterns 54, and the hard mask patterns 55 and have a line type structure extending in the extension direction of the buried bit lines.

Next, an insulation layer 56 is formed on the entire surface of the substrate 51 to cover the pillar structures 200. The insulation layer 56 may be formed by any one selected from a group of an oxide layer, a nitride layer, and an oxide nitride layer. For example, the insulation layer 56 may be formed by an oxide layer.

Next, a planarization process is performed on the surface of the insulation layer 56 to remove any steps generated on the surface in the process of forming the insulation layer 56 to cover the pillar structures 300 and may be performed by chemical-mechanical polishing (CMP).

Figure 3C:
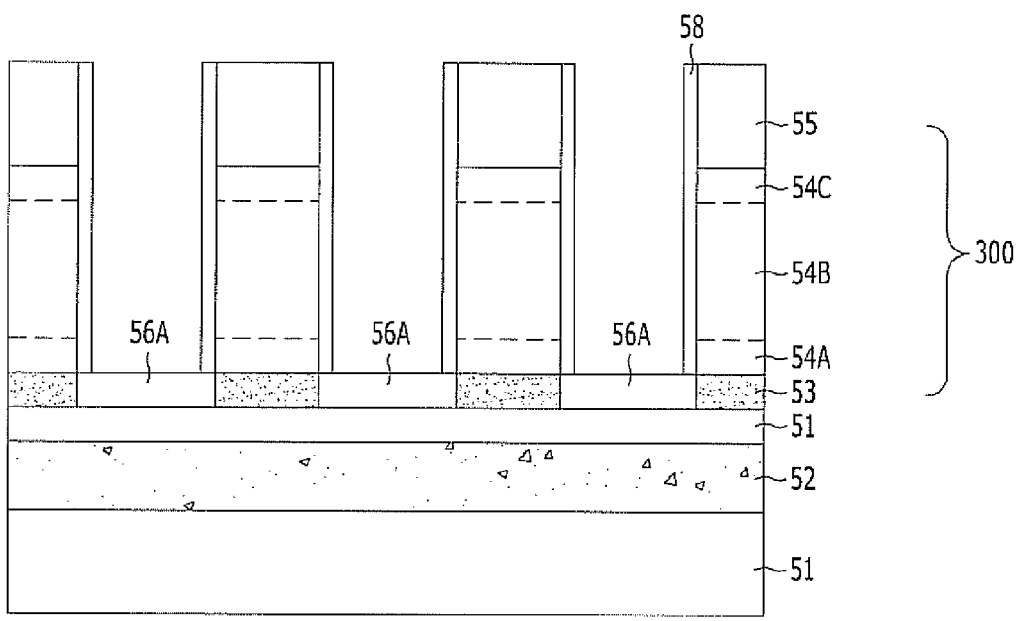

As illustrated in FIG. 3C, an etching process is performed on the insulation layer 56 until the sides of the active layer patterns 54 of the pillar structures 300 are exposed. As a result, a plurality of insulation patterns 56A are formed. At this time, the etching process is performed such that the insulation patterns 56A remains between the sacrificial layer patterns 53. The insulation patterns 56A may be etched by using any one of dry etching and a wet etching, or combination of dry etching and wet etching.

Next, spacers 58 are formed on the sides of the pillar structures 300. The spacers 58 have a function of protecting the sides of the pillar structures 300 in a subsequent process. The spacers 58 may be formed by any one selected from a group of an oxide layer, a nitride layer, and an oxide nitride layer and may be made of a substance having an etching selection ratio with the insulation layer 56. For example, the spacers 58 may be formed by a nitride layer.

Figure 3D:
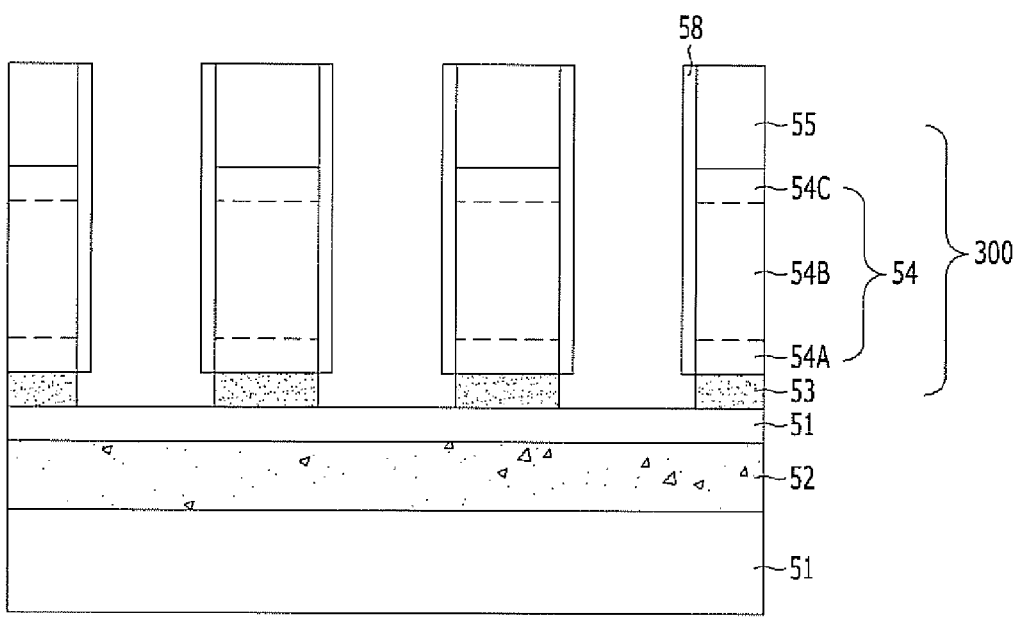

As illustrated in FIG. 3D, the insulating patterns 56A remaining in the pillar structures 300 are removed. That is, the sides of the sacrificial layer patterns 53 are exposed by removing the insulating pattern 56A remaining between the sacrificial layer patterns 53. The insulation patterns 56A may be etched by using any one of dry etching and wet etching, or combination of dry etching and wet etching.

Figure 3E:
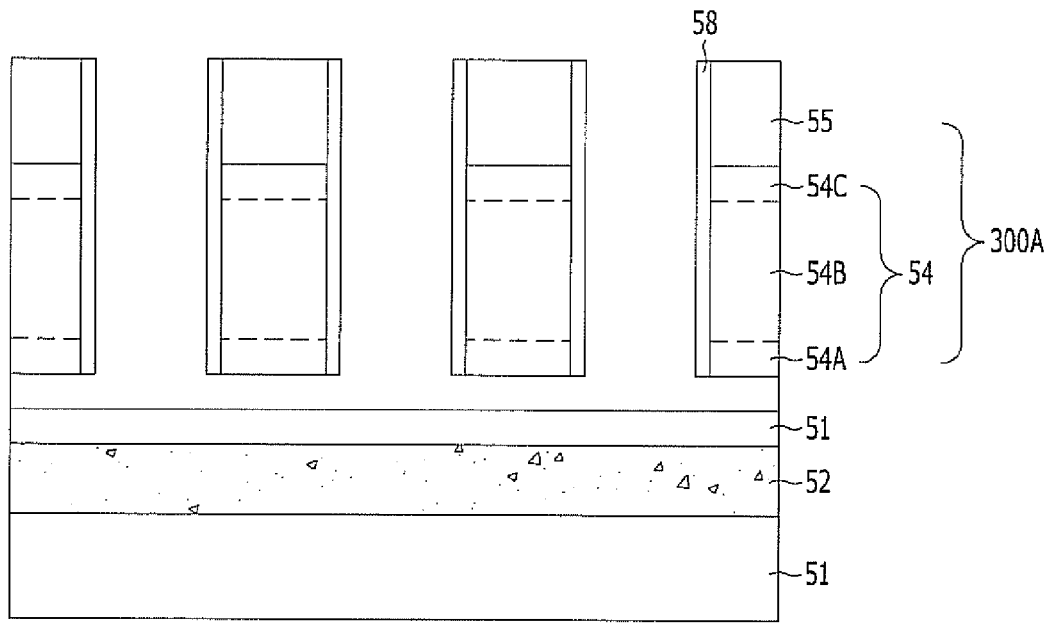

As illustrated in FIG. 3E, a space for forming buried bit lines under the active layer patterns 54 is provided by removing the sacrificial layer patterns 53 through the sides of the sacrificial layer patterns 53 exposed by removing of the insulation patterns 56A. The sacrificial layer patterns 53 may be etched by any one of dry etching and a wet etching, or combination of dry etching and wet etching. Hereafter, the pillar structures 300 with the sacrificial layer patterns 53 removed are designated by a reference numeral '300A'. The pillar structures 300A with the sacrificial layer patterns 53 removed have a structure in which the active layer patterns 54 and the hard mask patterns 55 are stacked and a line type structures extending in the extension direction of the buried bit lines.

Meanwhile, though not illustrated in the figures, both ends of the pillar structures 300A are fixed and there are regions with the sacrificial layer patterns 53 not removed and partially remaining by difference in gaps (or line width) between the pillar structures 300A, such that the pillar structures 300A may be prevented from falling down or deforming, even if the sacrificial layer patterns 53 are removed in order to provide a space for forming the buried bit lines.

Figure 3F:
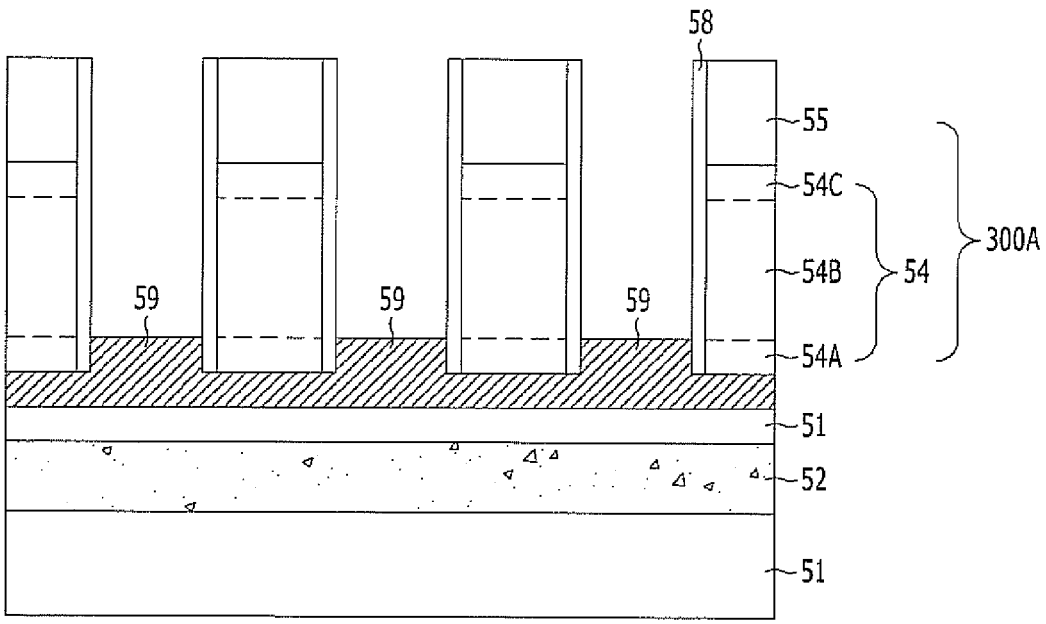

As illustrated in FIG. 3F, a conductive layer 59 that partially buries the portions between the pillar structures 300A while burying the space with the sacrificial layer patterns 53 removed is formed after a metal barrier layer (not illustrated) is formed along the structure surface including the pillar structures 300A. The conductive layer 59 operates the buried bit lines in a following process. Therefore, the conductive layer 59 may be formed by metal layers to form low-resistant buried bit lines. Further, the metal barrier layer has a function of preventing diffusion of the conductive layer 59 formed by metal layers.

Meanwhile, a process of forming silicide may be performed to reduce contact resistance in the regions where the active layer patterns 54, the substrate 51, and the conductive layer 59 are in contact, before forming the conductive layer 59.

Figure 3G:
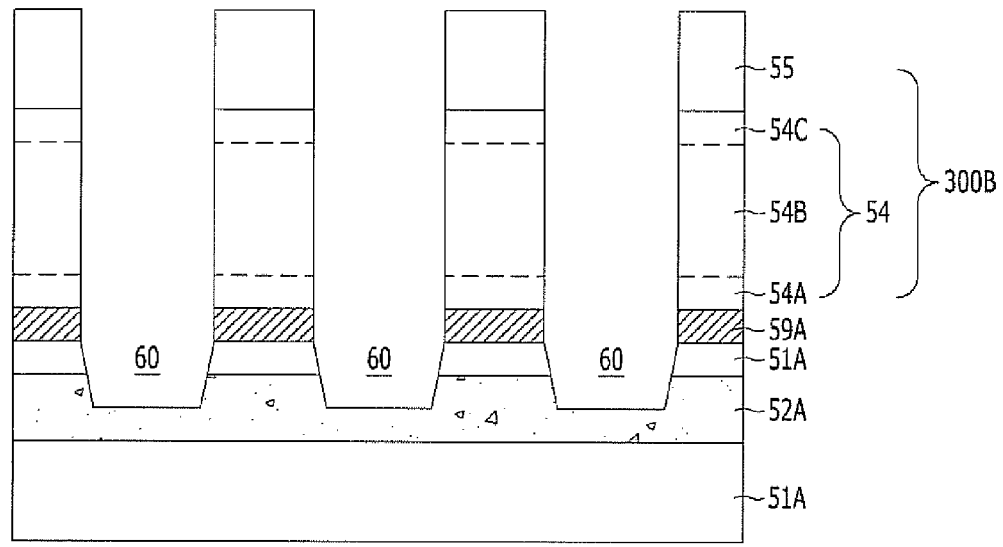

As illustrated in FIG. 3G, a plurality of buried bit lines 59A are formed by etching the conductive layer 59 and the substrate 51 with the hard mask patterns 55 as an etch barrier after the spacers 58 are removed. A trench 60 formed on a punch stop region 52A through a substrate 51A separates adjacent buried bit lines 59A in the process of forming the buried bit lines 59A and the bottoms of the trench 60 are to the depth to at least contact the punch stop region 52A to sufficiently separate adjacent buried bit lines. For example, the bottoms of the trench 60 may be in contact with the punch stop region 52A, the bottoms of the trench 60 may be positioned inside the punch stop region 52A, or the trench 60 may pass through the punch stop region 52A.

Next, although not illustrated, the pillar structures 300A are etched to intersect the buried bit lines 59A until the buried bit lines 59A are exposed. As a result, the pillar structures 300A have a pillar shape and are arranged in a matrix shape at desired distances from adjacent pillar structures 300A from the front to the rear and from the right to the left. Hereafter, the pillar structures 300A having pillar shapes are designated by a reference numeral '300B'.

Figure 3H:
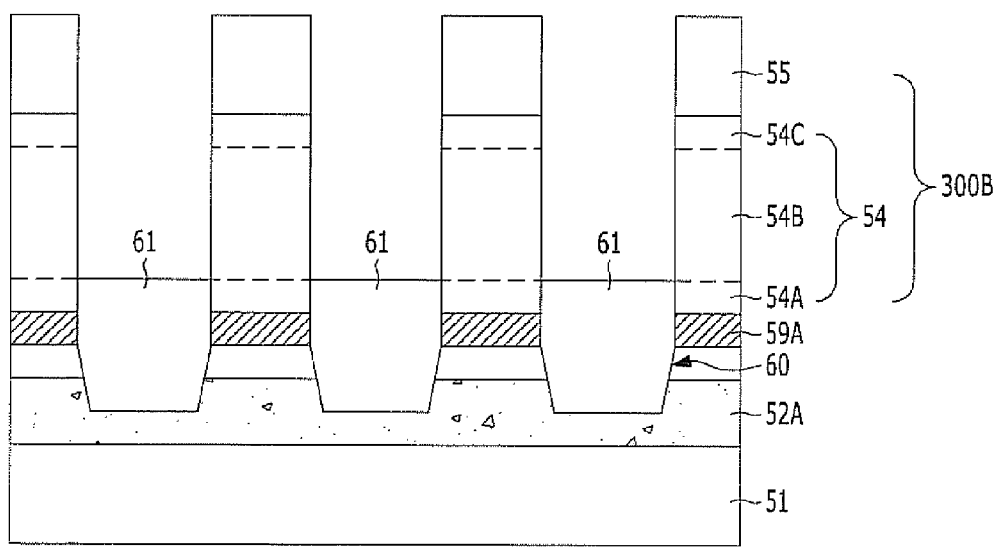

As illustrated in FIG. 3H, an isolation layer 61 that partially buries the portions between the pillar structures 300B while burying the trench 60 is formed. The isolation layer 61 may be formed to bury the portions between the pillar structures 300B and the first junction region 54A. Here, the upper surface of the isolation layer 61 may be positioned on the same plane as the interface between the first junction region 54A and the channel region 54B or positioned between the interface of the first junction region 54A and the channel region 54B and the interface of the first junction region 54A and the buried bit lines 59A.

The isolation layer 61 has a function of isolating adjacent buried bit lines 59A and isolating the buried bit lines 59A from subsequently formed word lines. Therefore, the isolation layer 61 may be formed by an insulation layer and the insulation layer may be any one selected from a group of an oxide layer, a nitride layer, and an oxide nitride layer. For example, the isolation layer 61 may be formed by an oxide layer.

Figure 3I:
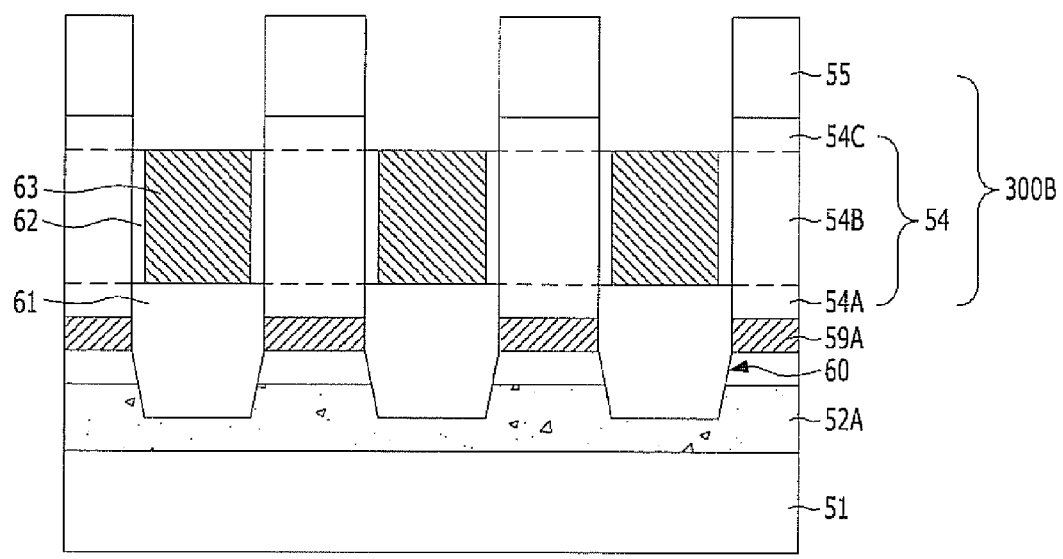

As illustrated in FIG. 3I, a gate insulation layer 62 is formed on the surfaces of the pillar structures 300B, in detail, on the surfaces of the channel region 54B of the active layer patterns 54. The gate insulating layer 62 may be formed by oxidation (for example, thermal oxidation) or deposition.

Next, a plurality of word lines 63 extending to intersect the buried bit lines 59A in contact with the pillar structures 300B are formed on the isolation layer 61. The word lines 63 may be formed by metal layers and may be in contact with selected sides of the pillar structures 300B or surround the pillar structures 300B. Since the gate insulation layer 62 is inserted between the word lines 63 and the pillar structures 300B, the word lines 63 also function as gate electrodes.

The word lines 63 may be formed by sequential processes of adjusting the height of a conductive layer by performing a recess process after depositing the conductive layer on the entire surface of the substrate 51 and then patterning the conductive layer in a line type of pattern extending to intersect the buried bit lines 59A.

Thereafter, although not illustrated in the figures, a semiconductor device with buried bit lines is completed by sequentially performing a process of forming a sealing layer that buries the portions between the pillar structures, a process of forming a storage node contact plug, and a process of forming capacitors.

Since the semiconductor device formed in accordance with the second embodiment of the present invention makes it easy to form the buried bit lines 59A by metal layers, low-resistant buried bit lines 59A may be easily implemented.

Further, since the structure of the semiconductor device is simple, the processes can be simplified even if the buried bit lines 59A are formed by metal layers. Thus, manufacturing productivity can be increased.

Figure 4A:
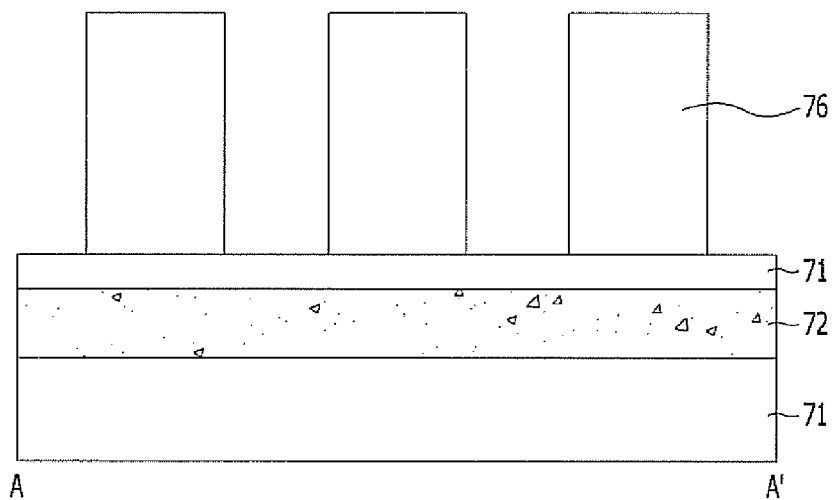
FIGS. 4A to 4C are cross-sectional views illustrating the processes of a method of fabricating a semiconductor device with buried bit lines in accordance with a third embodiment of the present invention.
Figure 4B:
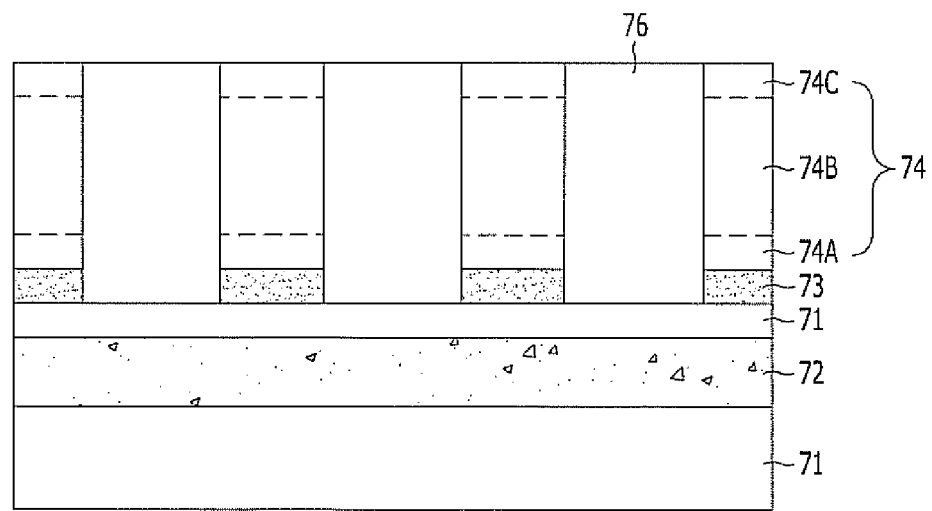
Figure 4C:
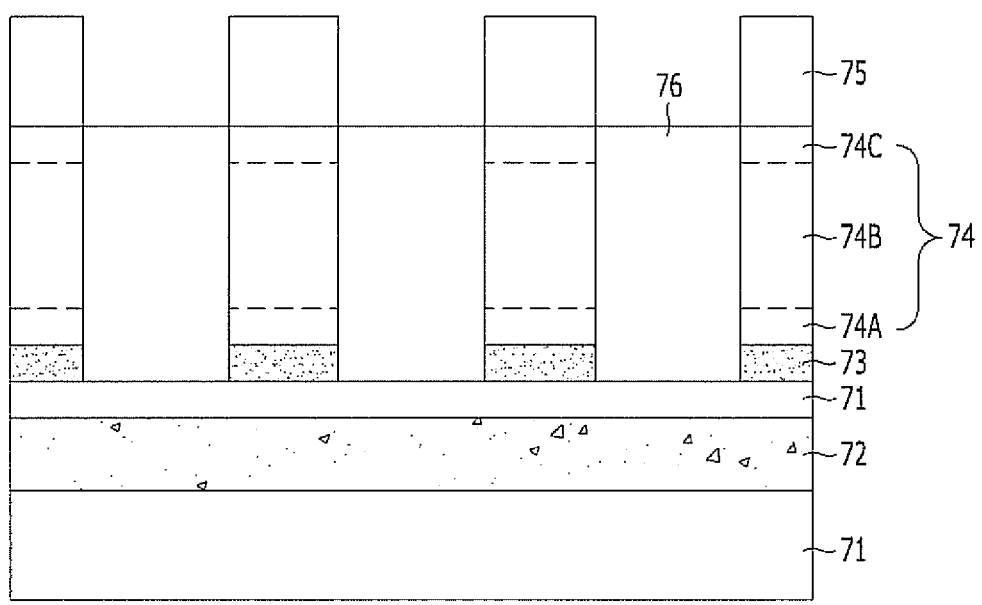

FIGS. 4A to 4C are cross-sectional views illustrating the processes of a method of fabricating a semiconductor device with buried bit lines in accordance with a third embodiment of the present invention. FIGS. 4A to 4C are views taken along the line A-A' of FIG. 1A.

As illustrated in FIG. 4A, a punch stop region 72 is formed in a substrate 71, for example, a silicon substrate. The punch stop region 72 has a function of preventing punch between buried bit lines that are formed by following processes. The punch stop region 72 may be disposed at a desired distance from the surface of the substrate 71 and positioned in the substrate 71 to obtain a higher breakdown voltage for the buried bit lines by disposing the substrate 71 between the subsequently buried bit lines and the punch stop region 72. The punch stop region 72 may be formed by ion-implanting dopant into the substrate 71, where the dopant may be a P-type dopant, for example, boron (B).

Next, insulation layer patterns 76 are formed on the substrate 71. The insulation layer patterns 76 provides spaces for forming buried bit lines and pillar structures, such that buried bit lines and pillar structures are formed in the spaces between the insulation layer patterns 76 in subsequent processes. The insulation layer patterns 76 may be formed as a line type extending in the extension direction of the buried bit lines.

As illustrated in FIG. 4B, a sacrificial layer 73 and an active layer 74 are sequentially formed to bury the portions between the insulation layer patterns 76. The sacrificial layer 73 and the active layer 74 may form an epitaxial layer grown by using an epitaxial growth method, and the sacrificial layer 73 and the active layer 74 may be formed by in situ in the same chamber. Further, the sacrificial layer 73 may be made of a substance having an etching selection ratio for the active layer 74 and the substrate 71. For example, the sacrificial layer 73 may be formed by an epitaxial silicon germanium layer, and the active layer 74 may be formed by an epitaxial silicon layer.

Since the active layer 74 serves as an active region, it may be formed by sequentially stacking a first junction region 74A, a channel region 74B, and a second junction region 74C, by implanting dopant in the process of forming the active layer 74 or ion-implanting dopant after forming the active layer 74. The first and second junction regions 74A and 74C may have the same conductive type, and the channel region 74B may have an opposite conductive type from the first and second junction regions 74A and 74C. For example, the conductive type of the first and second bonding regions 74A and 74C may be an N-type and the conductive type of the channel region 74B may be a P-type.

As illustrated in FIG. 4C, a hard mask pattern 75 covering the active layer 74 is formed by selectively etching the hard mask layer after forming the hard mask layer on the entire surface of the substrate 71. The hard mask pattern 75 may be formed as a line type extending in the extension direction of the buried bit lines. Therefore, the hard mask pattern 75 may be formed by a buried bit line mask.

Thereafter, a semiconductor device is completed by the method of fabricating a semiconductor device in accordance with the first embodiment of the present invention illustrated in FIGS. 2B to 2J or the method of fabricating a semiconductor device in accordance with the second embodiment of the present invention illustrated in FIGS. 3B to 3I.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a semiconductor device, comprising:
    forming a punch stop region in a substrate;
    forming a plurality of pillar structures over the substrate, wherein each of the pillar structures has a stack layer of a sacrificial layer and an active layer;
    removing the sacrificial layer;
    forming a conductive layer between the pillar structures in the space where the sacrificial layer is removed; and
    forming a plurality of buried bit lines under the pillar structures by selectively etching the conductive layer,
    wherein the respective buried bit lines, the substrate, and the punch stop region are disposed in a line vertical to the substrate.

2. The method of claim 1, wherein the punch stop region is formed by ion-implanting dopant into the substrate and formed in the substrate at some distance away from the surface of the substrate.

3. The method of claim 1, wherein the sacrificial layer and the active layer are epitaxial layers.

4. The method of claim 3, wherein the sacrificial layer includes an epitaxial silicon germanium layer and the active layer includes an epitaxial silicon layer.

5. The method of claim 1, wherein the sacrificial layer is made of a substance having an etching selectivity with respect to the active layer.

6. The method of claim 1, wherein the forming of pillar structures includes:
    sequentially forming the sacrificial layer and the active layer over the substrate;
    forming a hard mask pattern over the active layer; and
    etching the active layer and the sacrificial layer using the hard mask pattern as an etch barrier.

7. The method of claim 6, wherein the hard mask pattern is formed as a line pattern extending in the extension direction of the buried bit lines.

8. The method of claim 1, wherein the forming of pillar structures includes:
    forming a plurality of insulating layer patterns over the substrate;
    forming portions of the pillar structures located between the insulation layer patterns and forming a stacked layer of the sacrificial layer and the active layer; and
    removing the insulating layer patterns.

9. The method of claim 8, wherein the insulation layer pattern is formed as a line pattern extending in the extension direction of the buried bit lines.

10. The method of claim 1, wherein the removing of the sacrificial layer includes:
   forming an insulation layer covering the pillar structures over the entire surface of the substrate;
   forming a mask pattern covering a pair of pillar structures over the insulation layer;
   exposing sides of the sacrificial layer by etching the insulating layer using the mask pattern as an etch barrier; and
   removing the exposed sacrificial layer through a side wall.

11. The method of claim 1, wherein the method further comprises:
   forming an ohmic contact layer in a region where the substrate, the active layer, and the buried bit lines are in contact with each other before the forming of the conductive layer; and
   forming a metal barrier layer along the surface of the pillar structure with the sacrificial layer removed before the forming of the conductive layer.

12. The method of claim 1, wherein the conductive layer includes a metal layer.

13. The method of claim 1, further comprising:
   forming trenches by etching the substrate between the buried bit lines;
   forming an isolation layer in the trenches and a portion of space between the pillar structures; and
   forming a plurality of word lines over the isolation layer, wherein the word lines are in contact with the pillar structures and intersect the buried bit lines.

14. The method of claim 13, wherein the bottoms of the trenches are formed to contact with the punch stop region.

15. The method of claim 13, wherein the trenches are positioned to have bottoms of the trenches located inside the punch stop region or pass through the punch stop region.

16. The method of claim 13, wherein the word lines are in contact with selected sides of the pillar structures or surround the pillar structures.

* * * * *